(12) United States Patent
Oswald et al.

(10) Patent No.: US 7,259,321 B2
(45) Date of Patent: Aug. 21, 2007

(54) METHOD OF MANUFACTURING THIN FILM PHOTOVOLTAIC MODULES

(75) Inventors: Robert S. Oswald, Williamsburg, VA (US); Shengzhong Liu, Mechanicsville, VA (US)

(73) Assignee: BP Corporation North America Inc., Warrenville, IL (US)

( * ) Notice: Subject to any disclaimer, the term of this patent is extended or adjusted under 35 U.S.C. 154(b) by 512 days.

(21) Appl. No.: 10/336,374

(22) Filed: Jan. 3, 2003

(65) Prior Publication Data

US 2003/0180983 A1 Sep. 25, 2003

Related U.S. Application Data

(60) Provisional application No. 60/375,947, filed on Apr. 26, 2002, provisional application No. 60/346,327, filed on Jan. 7, 2002.

(51) Int. Cl.
*H01L 31/18* (2006.01)

(52) U.S. Cl. .................. 136/244; 136/258; 219/121.69

(58) Field of Classification Search ........ 136/243–265; 438/57–98, 463; 219/121.69
See application file for complete search history.

(56) References Cited

U.S. PATENT DOCUMENTS

| 4,713,518 | A | | 12/1987 | Yamazaki et al. ......... 219/121 |
| 4,892,592 | A | | 1/1990 | Dickson et al. ............ 136/244 |
| 5,136,136 | A | * | 8/1992 | Karube et al. ......... 219/121.73 |
| 5,593,901 | A | | 1/1997 | Oswald et al. ................ 437/2 |
| 6,168,968 | B1 | * | 1/2001 | Umemoto et al. ............ 438/96 |
| 6,559,411 | B2 | * | 5/2003 | Borgeson et al. ...... 219/121.69 |

FOREIGN PATENT DOCUMENTS

| EP | 1020934 A2 | 7/2000 |
| EP | 1061589 | * 12/2000 |

* cited by examiner

*Primary Examiner*—Nam Nguyen
*Assistant Examiner*—Jeffrey Barton
(74) *Attorney, Agent, or Firm*—Thomas E. Nemo

(57) ABSTRACT

A method for manufacturing a thin film photovoltaic module comprising series connected cells, the cells comprising a front contact, a back contact and a photovoltaically active region positioned between the front and back contacts, the series connected cell being formed by scribing a front contact layer, a photovoltaically active layer and a back contact layer on a substrate, the method comprising laser scribing at least one of the front contact layer, the photovoltaically active layer or the back contact layer to form laser scribes using a laser beam scanned rapidly over the layer.

20 Claims, 8 Drawing Sheets

7a

7b

METHOD OF MANUFACTURING THIN FILM PHOTOVOLTAIC MODULES

This application claims benefit of U.S. Provisional Patent Application Ser. No. 60/375,947 filed Apr. 26, 2002 and U.S. Provisional Patent Application Ser. No. 60/346,327 filed Jan. 7, 2002.

FIELD OF THE INVENTION

The present invention relates to photovoltaic cells and modules and methods for their manufacture. More particularly, the present invention relates to a method for manufacturing amorphous silicon, CdS/CdTe, CIS and other thin film based photovoltaic cells and modules wherein the scribes or grooves used, for example, to produce the individual series-connected cells in the modules are formed by a high speed process utilizing a laser beam scanned over the surface of the module.

A conventional thin film photovoltaic module typically comprises a front contact disposed on a substrate wherein the front contact is made of, for example, a metal oxide such as tin oxide or zinc oxide, a photovoltaically active region or layer such as a p-n (or PN), p-i-n (or PIN) junction, and a back or rear contact made of, for example, a metal such as aluminum. The simplest p-i-n or PIN junction includes a layer of a semiconductor material doped with a p-type dopant to form a p-layer, an undoped layer of a semiconductor material that forms an intrinsic or i-layer, and a layer of a semiconductor material doped with an n-type dopant to form an n-layer. The photovoltaically active region is positioned between the front and back contact. Light incident on the substrate passes through the substrate, the front contact, and the p-i-n junction. The light is reflected by the rear contact back into the p-i-n junction.

Typical methods for the manufacture of such photovoltaic modules use a laser or lasers to form a series of generally parallel grooves or scribes in the abovementioned metal oxide, semiconductor and metal layers of the module to divide or segment the module into a collection of individual, series connected cells. U.S. Pat. No. 4,532,371, which is incorporated herein by reference, discloses methods for manufacturing photovoltaic devices. In prior processes, these scribe lines were formed by moving the substrate containing the semiconductor and metal layers under the laser light beam, for example, using air bearing tables to move the substrate. Such a process is slow and requires costly equipment, and is particularly unsuitable for manufacturing photovoltaic modules that are substantially larger than the currently standard 0.65×1.2 meter modules because of the size of the moving table or other apparatus required to move the larger substrates under the laser beam. Larger sized modules, however, are preferred in architectural applications where a photovoltaic module replaces glass used to face a building or other structure thereby integrating photovoltaic generating capability with structural and aesthetic function.

The art therefore needs a more rapid, more efficient method to produce the laser scribes used to form the individual cells of thin film photovoltaic devices. The preset invention provides for such method and photovoltaic modules made by such method.

SUMMARY OF THE INVENTION

This invention is a method of manufacturing a photovoltaic device on a substrate, comprising the steps of:

(a) depositing a transparent and electrically conductive film on the substrate to form a front contact layer;

(b) laser scribing substantially parallel first grooves in the front contact layer with a scanning laser beam to form front contact segments on the monolithic substrate;

(c) depositing and forming a layer or layers of a semiconductor material on the front electrode segments, and filling the first grooves with the semiconductor material;

(d) laser scribing second grooves in the layer or layers of semiconductor material with a scanning laser beam at positions adjacent to the first grooves;

(e) depositing and forming a back contact layer comprising a metal on the layer or layers of semiconductor material, and filling the second grooves with the metal to form a series connection to connect the front electrode segments and the back contact layer; and (f) laser scribing third grooves in the back contact layer with a scanning laser beam at positions adjacent to said second grooves.

This invention is also a photovoltaic module comprising photovoltaic series connected cells on a supporting substrate, comprising a front contact layer, a layer or layers of photovoltaically active semiconductor material, and a back contact layer comprising a metal, the front contact layer, semiconductor layers and back contact layer having scribes formed by a scanning laser to form the series connected cells.

DETAILED DESCRIPTION OF THE INVENTION

Photovoltaic cells that convert radiation and particularly solar radiation into usable electrical energy can be fabricated by sandwiching certain semiconductor structures, such as, for example, the amorphous silicon PIN structure disclosed in U.S. Pat. No. 4,064,521, which is incorporated herein by reference, or cadmium sulfide/cadmium telluride (CdS/CdTe) structures between two electrodes. Methods for making CdS/CdTe photovoltaic devices are disclosed in, for example, N. R. Pavaskar, et al., J. Electrochemical Soc. 124 (1967) p. 743; I. Kaur, et al., J. Electrochem Soc. 127 (1981) p. 943; Panicker, et al., "Cathodic Deposition of CdTe from Aqueous Electrolytes," J. Electrochem Soc. 125, No. 4, 1978, pp. 556-572, U.S. Pat. No. 4,400,244; EP Patent 244963; U.S. Pat. No. 4,548,681; EP Patent 0538041; U.S. Pat. No. 4,388,483; U.S. Pat. No. 4,735,662; U.S. Pat. No. 4,456,630: U.S. Pat. No. 5,472,910; U.S. Pat. No. 4,243,432; U.S. Pat. No. 4,383,022, "Large Area Apollo® Module Performance and Reliability" $28^{th}$ IEEE Photovoltaic Specialists Conference, Anchorage, Ak., September 2000; all of which are incorporated by reference herein.

One of the electrodes typically is transparent to permit solar radiation to reach the semiconductor material. This "front" electrode (or contact) can be comprised of a thin film, for example, less than 10 micrometers in thickness, of transparent conductive oxide material, such as tin oxide or zinc oxide, and usually is formed between a transparent supporting substrate made of glass or plastic and the photovoltaic semiconductor material. The "back" or "rear" electrode (or contact), which is formed on the surface of the semiconductor material opposite the front electrode, generally comprises at least a thin film of metal such as, for example, aluminum or silver, or the like, or a thin film of metal and a thin film of a metal oxide such as zinc oxide between the semiconductor material and the metal thin film.

The metal oxide can be doped with boron or aluminum and is typically deposited by low-pressure pressure chemical vapor deposition.

FIG. 1 shows a thin film photovoltaic module 10 comprised of a plurality of series-connected photovoltaic cells 12 formed on a transparent substrate 14, e.g., glass, and subjected to solar radiation or other light 16 passing through substrate 14. (A series of photovoltaic cells is a module.) Each photovoltaic cell 12 includes a front electrode 18 of transparent conductive oxide, a transparent photovoltaic element 20 made of a semiconductor material, such as, for example, hydrogenated amorphous silicon, and a back or rear electrode 22 of a metal such as aluminum. Photovoltaic element 20 can comprise, for example, a PIN or PN structure. Adjacent front electrodes 18 are separated by first grooves 24, which are filled with the semiconductor material of photovoltaic elements 20. The dielectric semiconductor material in first grooves 24 electrically insulates adjacent front electrodes 18. Adjacent photovoltaic elements 20 are separated by second grooves 26, which are filled with the metal of back electrodes 22 to provide a series connection between the front electrode of one cell and the back electrode of an adjacent cell. These connections are referred to herein as "interconnects." Adjacent back electrodes 22 are electrically isolated from one another by third grooves 28. In the method of this invention, one or more of the scribes or grooves separating such a front electrode into segments, the scribes or grooves used to form such interconnects, and the scribes or grooves in the back electrode to form such electrically isolated electrodes, are formed by a laser beam scanned over the module during its stages of manufacture. Preferably, in the scanning process the laser is fixed in position and the laser beam passes through a scanner where X-Y mirrors, preferably operated by galvanometers, reflect and direct the laser beam to the appropriate locations on the module to form the desired laser scribes or grooves. Suitably, the laser beam, prior to entering the scanner device, is passed through a beam expander and then through a dynamic focusing optical unit. Thus, in the method of this invention it is not necessary to move the substrate along the scribing direction containing the various metal oxide, semiconductor and metal layers in order to form the laser scribes. Rather the laser beam, preferably by operation of the scanner, scans over the substrate to form the desired scribes. It is possible by this method to form the desired scribes in a rapid and efficient manner on photovoltaic modules having a wide variety of dimensions, including large modules.

The thin-film photovoltaic module such as the one depicted in FIG. 1 typically is manufactured by a deposition and patterning method. One example of a suitable technique for depositing an amorphous silicon semiconductor material on a substrate is to use a glow discharge in silane, as described, for example, in U.S. Pat. No. 4,064,521. Several patterning techniques are conventionally known for forming the grooves separating adjacent photovoltaic cells as described above, including silkscreening with resist masks, etching with positive or negative photoresists, mechanical scribing, electrical discharge scribing, and laser scribing. Laser scribing has emerged as a practical, cost-effective, high-volume processes for manufacturing thin-film semiconductor devices, including thin-film amorphous silicon photovoltaic modules. Laser scribing has an advantage because it can separate adjacent cells in a multi-cell device by forming separation grooves having a width less than 25 micrometers, compared, for example, to a typical silk-screened groove width of approximately 300-500 micrometers. A photovoltaic module fabricated with laser scribing thus has a large percentage of its surface area actively engaged in producing electricity and, consequently, has a higher efficiency than a module fabricated by, for example, silkscreening. A prior method of laser scribing the layers of a photovoltaic module is disclosed in U.S. Pat. No. 4,292,092, which is incorporated herein by reference.

Referring to FIG. 1, a method of fabricating a multi-cell photovoltaic module using laser scribing comprises; depositing a continuous film of transparent conductive oxide on a transparent substrate 14, laser scribing first grooves 24 to separate the transparent conductive oxide film into front electrodes 18, fabricating a continuous film of semiconductor material on top of front electrodes 18 and in first grooves 24, laser scribing second grooves 26 parallel and adjacent to first grooves 24 to separate the semiconductor material into individual photovoltaic elements 20 (or "segments") and expose portions of front electrodes 18 at the bottoms of the second grooves, forming a continuous film of metal on segments 20 and in second grooves 26 so that the metal forms electrical connections with front electrodes 18, i.e., the interconnects, and then laser scribing third grooves 28 parallel and adjacent to second grooves 26 to separate and electrically isolate adjacent back electrodes 22. As shown in FIG. 1, the third grooves 28 are scribed in the metallic back electrode from the back contact side or face of the photovoltaic cell. However, as will be described herein, the scribing of the back electrode can occur from the other side of the module. In the method of this invention, scribes or grooves are formed by a high speed, efficient laser scanning process where the laser is scanned over the substrate during its stages of manufacture in a rapid, controlled manner to form the desired scribes.

The first and last cell of a module generally has bus bars that provide for a means to connect the module to wires or other electrically conductive elements. The bus bars generally run along the length of the outer, long portion of the first and last cell.

BRIEF DESCRIPTION OF THE DRAWING

The accompanying drawings, which are incorporated in and which constitute a part of the specification, illustrate at least one embodiment of the invention and, together with the description, explain the principles of the invention.

DESCRIPTION OF THE PREFERRED EMBODIMENT(S)

Reference now will be made in detail to embodiments of the invention, examples of which are illustrated in the accompanying drawings.

Figure 1:
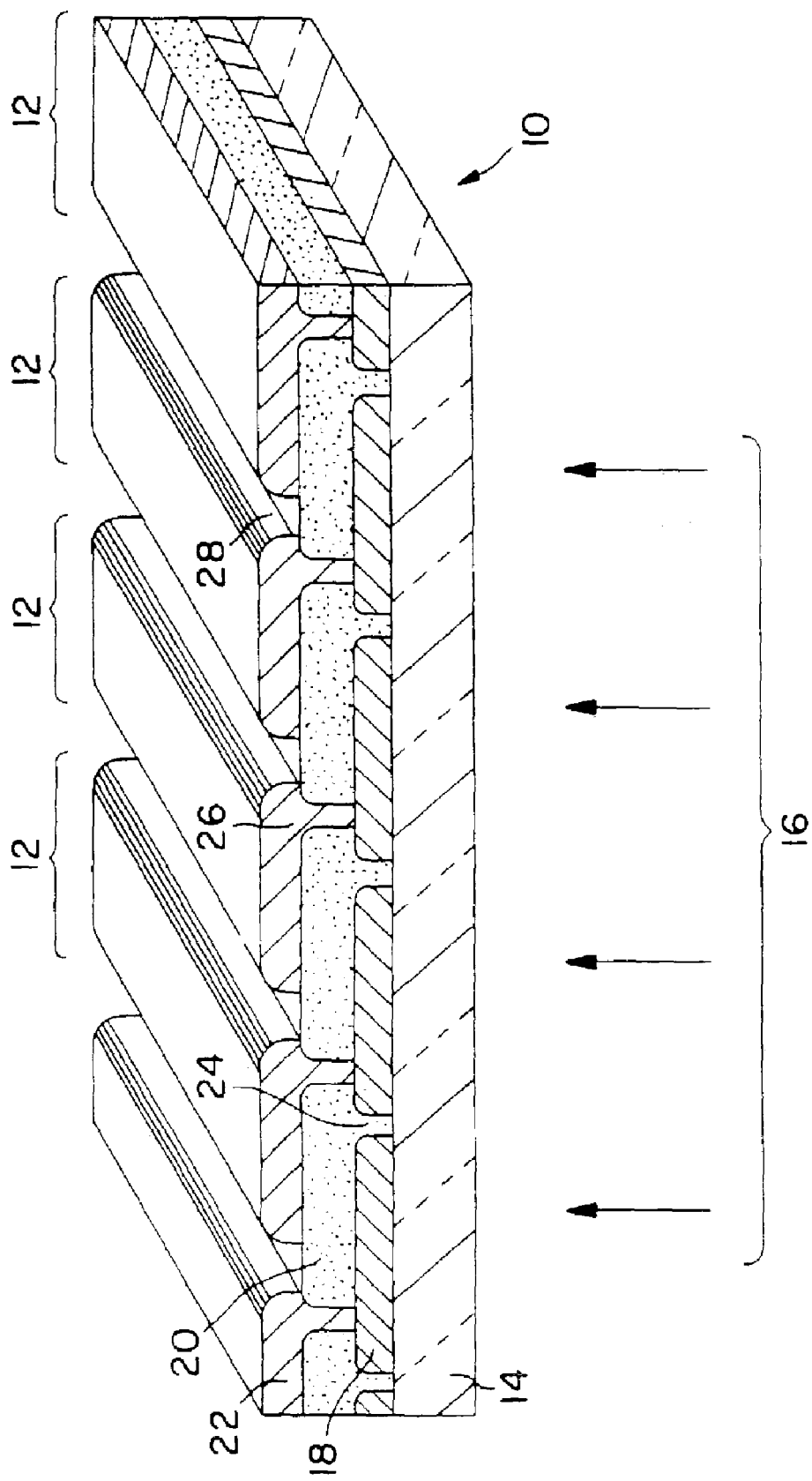
FIG. 1 is a schematic perspective view of a typical thin film photovoltaic module that can be fabricated according to the method of this invention.
Figure 2A:
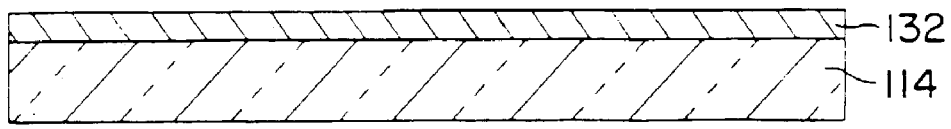
FIGS. 2(a)-2(g) are schematic cross sectional views depicting the steps in a method for fabricating another type of thin film photovoltaic module that can be fabricated according to the method of this invention.
Figure 2B:
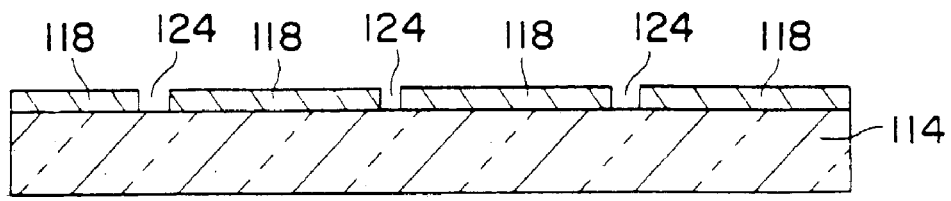
Figure 2C:
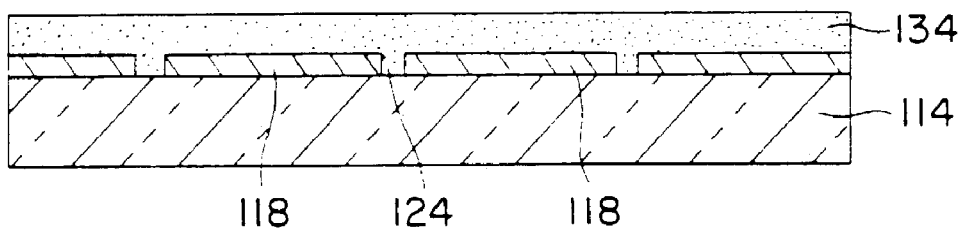
Figure 2D:
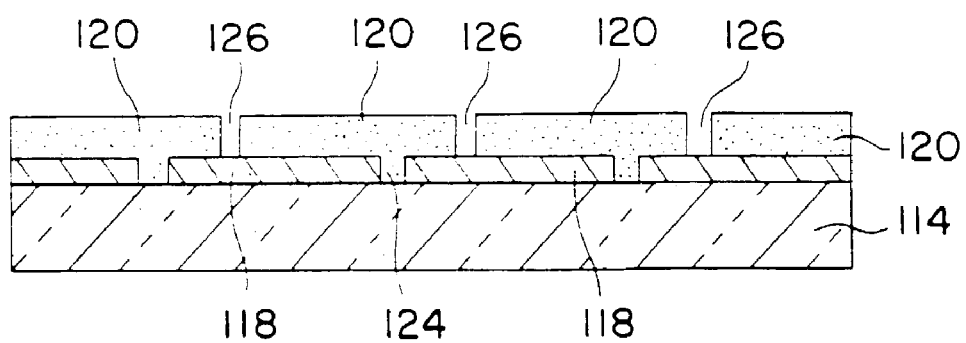
Figure 2E:
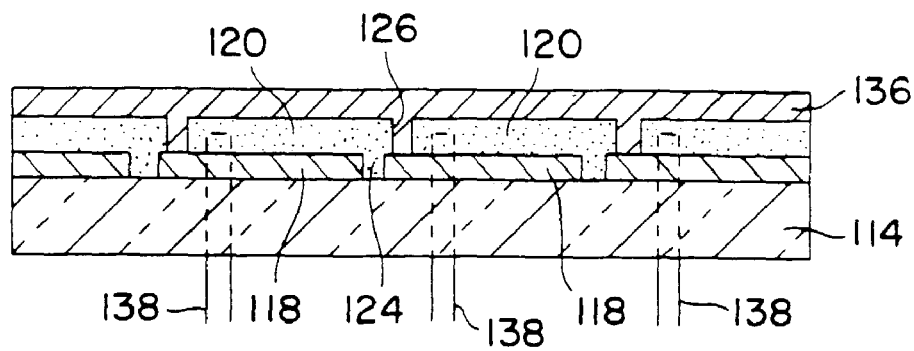
Figure 2F:
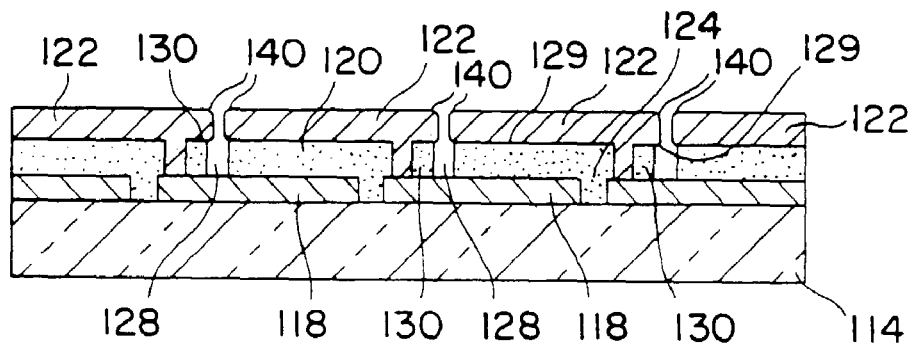
Figure 2G:
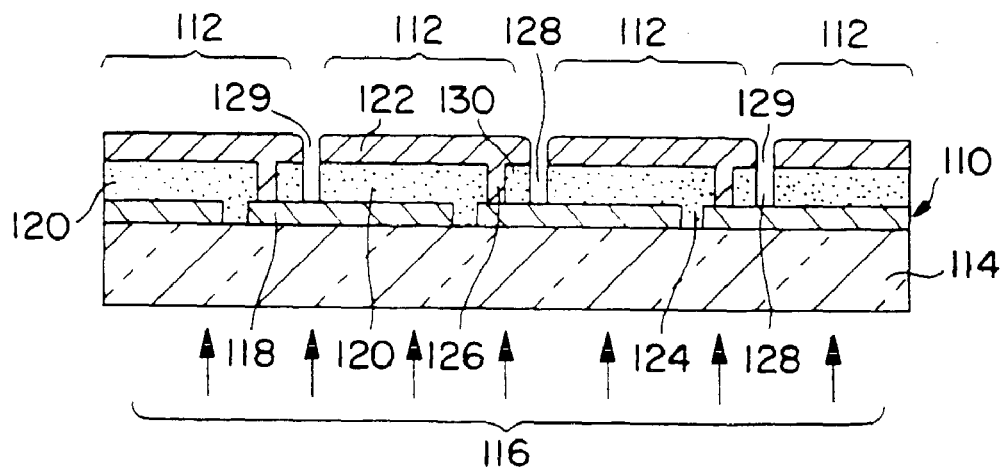
Figure 3:
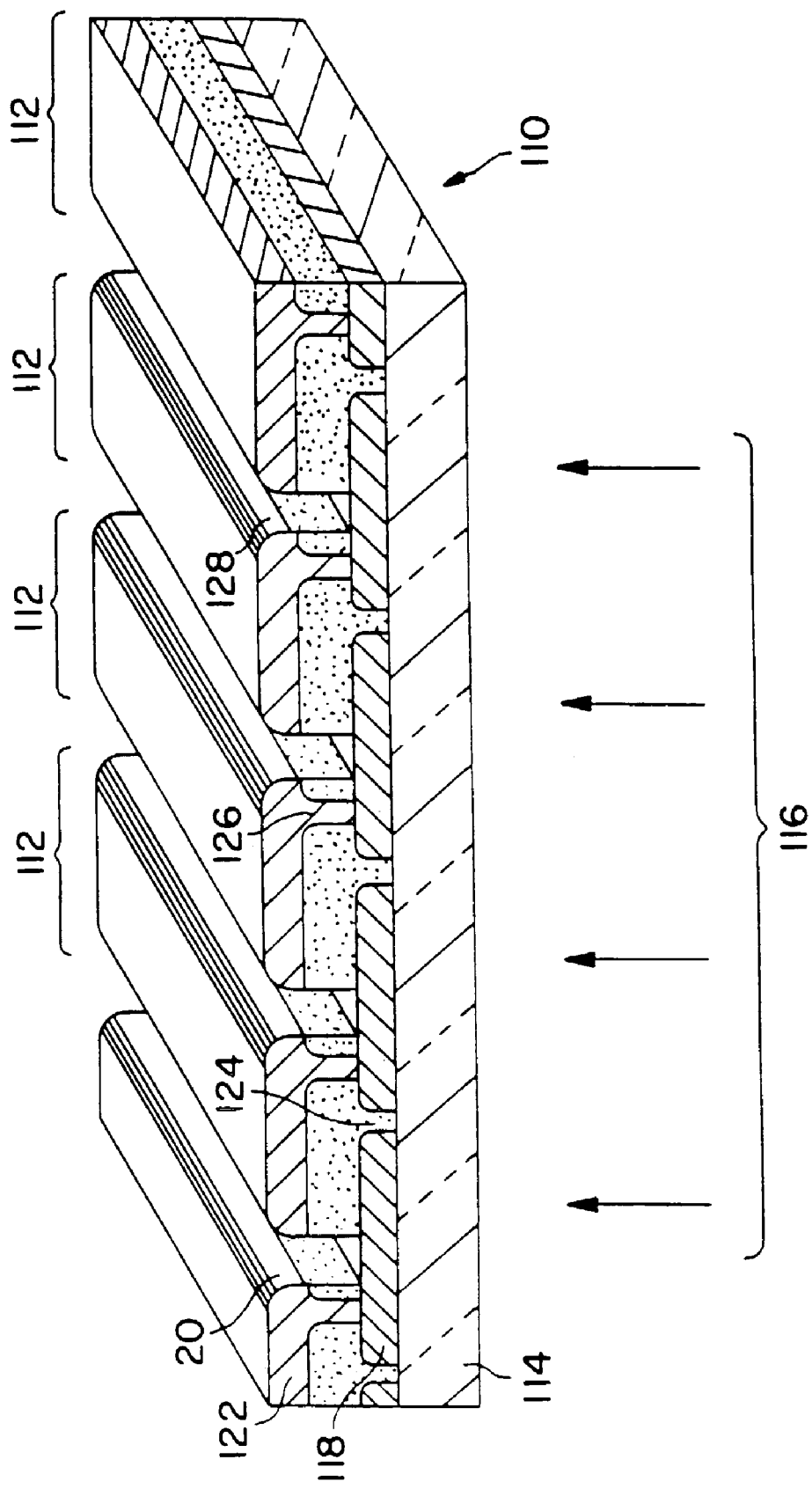
FIG. 3 is a schematic perspective view of the module of FIG. 2(g).

FIG. 2(g) is a schematic cross sectional view of a portion of a multi-cell thin-film photovoltaic module, designated generally by reference numeral 110. Photovoltaic module 110 is comprised of a plurality of series-connected photovoltaic cells 112 formed on a flat, transparent substrate 114. In operation, photovoltaic module 110 generates electricity in response to light, particularly solar radiation, 116, passing through substrate 114, which preferably is formed of glass. Each photovoltaic cell 112 includes a front electrode segment 118 comprising a transparent conductive oxide, a photovoltaic element 120 comprising a semiconductor material, such as, for example, hydrogenated amorphous silicon, and a back electrode 122 comprising a metal, preferably aluminum, and optionally a metal oxide such as zinc oxide. Adjacent front electrode segments 118 are separated by first grooves 124, which are filled with the semiconductor material of photovoltaic elements 120. Adjacent photovoltaic elements 120 are separated by second grooves 126 and also by third grooves 128. An inactive portion 130 of semiconductor material is positioned between second groove 126 and third groove 128. Portions 130 are "inactive" in the sense that they do not contribute to the conversion of light 116 into electricity. Second grooves 126 are filled with the material of back electrodes 122 to provide a series connection between the front electrode of one cell and the back electrode of an adjacent cell. These connections are referred to as interconnects. Gaps 129, located at the tops of third grooves 128, separate and electrically isolate adjacent back electrodes 122. A series of photovoltaic cells, 112 as shown in FIG. 2(g) comprise a module. The module can have a large number of individual cells. Two or more modules can be connected in parallel to increase the current of the photovoltaic device. If a series of photovoltaic cells 112 are used, the contact of the first and last cell must be available for attaching a wire or other conductive element in order to connect the module to a device or system that will use the electric current generated by the module. Generally, a conductive strip or "bus bar" is added to the outside of the first and last cell in the module (i.e., parallel to the grooves). These bus bars are used to make the electrical connection to the device that will utilize the electrical current generated when the module is exposed to light. Methods for applying the bus bars and for connecting sub-modules in parallel to achieve modules with higher current are disclosed in U.S. Pat. No. 5,593,901, which is incorporated herein by reference.

The method for forming a photovoltaic module 110 now will be described with reference to FIGS. 2(a) through 2(g). It should be understood however, that while the description below is directed to an amorphous silicon-containing thin film photovoltaic module, this invention is not so limited and can be used to make other photovoltaic devices such as the thin film photovoltaic devices containing CdS/CdTe, copper-indium selenide (CIS), organic dyes and other materials as the photovoltaically active elements.

Conductive transparent oxide (CTO), such as, for example, one or more of indium-tin-oxide, zinc oxide, cadmium stannate or tin oxide, preferably a fluorinated tin oxide, is deposited on a substrate, such as glass, to form a front contact layer 132, or glass having the conductive oxide, such as tin oxide, already deposited thereon can be obtained from suitable glass suppliers. The CTO layer is preferably less than about 10,000 Å in thickness. The CTO layer can have a smooth or textured surface. The textured surface is preferred for application of the photoelectric device of this invention where the greatest electric generating efficiency is desired. Next a bead or strip of conductive material, preferably silver (Ag) containing materials, is deposited on the outside edges of two opposite sides of CTO layer 132 to form bus bars.

Following thermal cure, if required, of the beads or strips of conductive material, the front contact layer 132 is laser scribed to form scribe lines 124.

These scribes, for example, can be about 10 micrometers to about 150 micrometers wide, preferably about 15 micrometers to about 80 micrometers wide, and suitably spaced about 0.5 cm to about 2.5 cm, more preferably about 0.8 cm to about 1.2 cm from each other. The spacing of these scribes will determine the maximum width of the individual cells on the photovoltaic module. Typically, these laser scribes in the front contact run from near one edge of the substrate to the opposite edge, for example, from about 0.5 cm to about 2.0 cm from the edge of the substrate. The scribes, however, can extend to the edge or close to the edge of the substrate. The scribes are typically parallel to one another, are typically straight, and typically parallel to the edge of the substrate. If the substrate is rectangular, these scribes preferably run parallel to the longer edge of the substrate.

To form these scribes in the front contact one or more laser beams are directed at the substrate and scanned across the surface of the front contact material thereby removing the front contact material in the desired pattern. As long as the substrate is made of a material that is transparent at the laser wavelength used to form the scribes, the scribes can be carried out from either side of the substrate, i.e., from the side with the front contact deposited thereon or from the other side by passing the laser beam through the substrate. The laser selected as well as the wavelength of the laser light, the pulse-width of the laser, the laser beam shape and the repetition rate are selected to efficiently remove the front contact. The laser used to form the scribes in the front contact in the method of this invention is preferably an eximer laser, for example, an ArF (193 nm), KrF (248 nm), XeCl (308 nm), XeF (351 nm) laser, or a solid state laser, for example, a Nd:YAG, Nd:YLF, or Nd:YVO$_4$ laser. For solid state lasers the second harmonic is preferably used. The laser used to form the scribes in the front contact preferably operates at a wavelength of about 190 nanometers (nm) to about 1,200 nm and suitably at a pulse-width of about 1 nanosecond to about 500 nanoseconds, more preferably of about 5 to about 100 nanoseconds, a repetition rate (reprate or pulse frequency) suitably of about 100 Hertz (Hz) to about 400 kHz, more preferably about 1 kHz to about 200 kHz. A reprate of about 50 KHz or more can be used and the reprate can be up to about 400 KHz or more, or 500 KHz or more. The beam shape is suitably top hat, delta function, or Gaussian. Preferably it is Gaussian. Optics, available commercially, can be used to shape the laser beam to a desired beam shape or profile. It is preferable to scan the front contact to form the scribes at rate that is about 0.1 meters/second to about 50 meters/second, more preferably about 0.5 meters/second to about 20 meters/second. Scribe rates of 1 or more, or 5 or more, or 10 or more meters/second can also be used. Following laser scribing of scribe lines 124, the remaining steps in the fabrication of the photovoltaic module as shown in FIGS. 2(c) to 2(g) as described herein are performed as described below.

It should be noted that in FIGS. 2(a) to 2(g), the front contact layer 132 is shown but the bus means are not. It should be understood, however, that bus means are typically disposed on front contact layer 132 in the manner described above following which the steps shown in FIGS. 2(c) to 2(g) are performed.

A photovoltaic region comprised of a substantially continuous thin film 134 of semiconductor material is fabricated over front electrodes 118 and in first grooves 124, as shown in FIG. 2(c). The semiconductor material filling first grooves 124 provides electrical insulation between adjacent front electrodes 118. Preferably, the photovoltaic region comprises hydrogenated amorphous silicon in a conventional PIN structure (not shown) and is typically up to about 5000 Å in thickness, typically comprising a p-layer suitably having a thickness of about 30 Å to about 250 Å, preferably less than about 150 Å, and typically of about 100 Å, an i-layer of 2000-4500 Å, and an n-layer of about 200 to about 400 Å. Deposition preferably is by glow discharge in silane or a mixture of silane and hydrogen, as described, for example, in U.S. Pat. No. 4,064,521. Alternatively, the semiconductor material may be CdS/CuInSe$_2$, CdS/CdTe or other photovoltaically active materials. Methods for making CdS/CdTe are described hereinabove. The semiconductor layer can comprise a single PIN type layer. However, the photovoltaic devices of this invention can have additional semiconductor layers, for example, it can be a tandem or triple-junction structure. Suitable semiconductor layers useful in the photovoltaic devices of this invention and methods for their manufacture are described, for example, in United Kingdom Patent Application No. 9916531.8 (Publication No. 2339963, Feb. 9, 2000), which is incorporated herein by reference.

The semiconductor layer or film 134 then is scribed with a laser to ablate the semiconductor material along a second predetermined pattern of lines to form second grooves 126, which divide semiconductor film 134 into a plurality of photovoltaic elements 120, as shown in FIG. 2(d). Front electrodes 118 are exposed at the bottoms of second grooves 126. Scribing may be performed with the same laser used to scribe transparent conductive oxide layer 132, except that power density is typically reduced to a level that will ablate the semiconductor material without affecting the conductive oxide of front electrodes 118. The laser scribing of semiconductor film 134 can be performed from either side of substrate 114. Second grooves 126 preferably are scribed adjacent and parallel to first grooves 124 and about 10 to about 1000 micrometer in width, preferably, about 30 micrometers to about 150 micrometers in width, preferably from about 40 micrometers to about 80 micrometers in width and suitably spaced about 25 micrometers to about 150 micrometers, more preferably about 25 micrometers to about 100 micrometers from the scribes in the front contact.

To form scribes in the amorphous silicon layer or other photovoltaically active layers in accordance with the method of this invention, one or more laser beams are directed at the amorphous silicon layer and scanned across its surface in the desired pattern thereby removing the amorphous silicon layers but not the conductive oxide of the front contact located below such scribes. The laser selected as well as the wavelength of the laser light, the pulse-width of the laser, the laser beam shape and the repetition rate are selected to efficiently remove the amorphous silicon layer in the desired areas to form the scribes. For example, the laser can be a Nd:YAG laser operating at a wavelength of about 532 nanometers. The laser can be a Nd:YLF or Nd:YVO4-based laser. Both fundamental wavelength at 1064 nm and harmonic wavelengths at 532 nm and 355 nm can be used. Eximer lasers, for example, ArF (193 nm), KrF (248 nm), XeCl (308 nm), and XeF (351 nm) lasers can also be used for forming the scribes in the semiconductor layer. The laser used suitably has a pulse-width of about 1 nanosecond to about 500 nanoseconds, more preferably of about 5 nanosecond to about 100 nanoseconds, a repetition rate suitably of about 10 kHz to about 400 kHz, more preferably about 30 kHz to about 200 kHz. The reprate can be about 40 KHz or more, or about 50 KHz or more, and can be up to about 300 KHz or more, or about 400 KHz or more. The beam shape can be Gaussian, top hat, or delta function. Preferably, the beam shape for scribing the amorphous silicon layers to form the interconnect scribes is Gaussian. It is preferable to scan the semiconductor layers to form the interconnect scribes at a rate that is about 0.1 meters/second to about 50 meters/second, more preferably about 0.8 meters/second to about 20 meters/second. Scribe rates of 1 or more, or 5 or more, or 10 or more meters/second can also be used. For the interconnect scribes in the semiconductor layers, the scribes can be discontinuous. That is, the scribe does not have to be continuous across all of its length. For example it can be a series of spaced holes such as round or linear shaped holes separated by spaces where the semiconductor layer was not removed.

A thin film of metal 136, such as one or more of silver, molybdenum, platinum, copper, gold, steel, iron, niobium, titanium, chromium, bismuth, antimony, metallic alloys or preferably aluminum, is fabricated over photovoltaic elements 120 and in second grooves 126, as shown in FIG. 2(e). The conductive material filling second grooves 126 provides electrical connections between film 136 and the portions of front electrodes 118 exposed at the bottoms of second grooves 126. Conductive film 136 is formed, for example, by sputtering or other well-known techniques. The thickness of film 136 depends on the intended application of the module. As an example, for modules intended to generate sufficient power to charge a 12-volt storage battery, metal film 136 typically is formed of aluminum and can be about 2000-6000 Å thick.

The next step is to scribe metal film 136 with a laser to ablate the metal along a pattern of lines and form a series of scribes dividing the metal film 136 into a plurality of back electrodes. To form scribes in a back contact metal layer in accordance with the method of this invention, one or more laser beams are directed at the metal layer and scanned across its surface in the desired pattern thereby removing the metal layer.

The laser can be directed to the top of the back contact so that the back contact is directly ablated or removed by the laser. In a preferred technique, particularly where the photovoltaically active region comprises one or more amorphous silicon-containing layers, the laser beam is directed through the transparent substrate and through the transparent amorphous silicon-containing layers to ablate the rear contact. Therefore, after fabrication of metal film 136, the photovoltaic regions 120 underlying metal film 136 are preferably scribed with a laser operated at a power density sufficient to ablate the semiconductor material along a predetermined pattern of third lines preferably parallel to and adjacent second grooves 126 but insufficient to ablate the conductive oxide of front electrodes 118 or the metal of film 136. More specifically, the laser is preferably operated at a power level that will ablate the semiconductor material and produce particulates that structurally weaken and burst through the portions of the metal film positioned along the third lines to form substantially continuous gaps in the metal film along the third lines and separate the metal film into a plurality of back electrodes. As shown in FIG. 2(e), where the laser beams are shown schematically and designated by reference numerals 138, laser patterning of metal film 136 by ablation of the underlying semiconductor material is performed through substrate 114. In a preferred method of operation, the laser is used to generate shock waves by using short pulses of high laser beam energy. This enhances the removal of the back contact and reduces shunting.

The laser used to remove the desired sections of the back contact is preferably a continuous wave laser or more preferably a pulsed laser. The laser can be an ultraviolet laser such as an eximer laser, for example, an ArF (193 nm), KrF (248 nm), XeCl (308 nm), or XeF (351 nm) laser, and the like, or a third or forth harmonic of a Nd:YAG, Nd:YLF or Nd:YVO$_4$ laser. The laser can also be a visible or infrared laser. Most preferably, the laser used is a visible laser, preferably a green laser, for example, a frequency doubled Nd-YAG, Nd-YLF or Nd-YVO$_4$ laser. It is preferable to use a high repeating rate, high power laser, such as a Nd:YVO$_4$ laser. Preferably, the laser used operates at about 20-100 kHz at a rapid scribing speed of, for example, about 1-20 meters per second with a spot size of, for example, 0.1 to about 0.2 mm.

The laser used suitably has a pulse-width of about 10 nanosecond to about 100 nanoseconds, more preferably about 10 to about 30 nanoseconds, a repetition rate suitably of about 1 kHz to about 200 kHz, more preferably about 10 to about 30 kHz. The repetition rate can be about 30 KHz or more, about 40 KHz or more, or about 50 KHz or more, and can be up to about 400 KHz or more or about 500 KHz or more. The beam shape is suitably Gaussian, top hat, or delta function. For certain scribes Gaussian beam shape may be disadvantageous because it tends to concentrate laser energy in the center of the spot. Therefore, a top hat laser profile may be preferred because it generally provides for more uniform energy distribution within the laser spot. For laser scribing the back contact in the method of this invention, such a top hat laser profile is preferred. It is preferable to scan the amorphous layer a rate that is about 0.1 meters/second to about 50 meters/second, more preferably about 0.8 meters/second to about 20 meters/second to form the desired scribes in the back contact. Scribe rates of 1 or more, or 5 or more, or 10 or more meters/second can also be used.

Third grooves or scribes 128 in the back contact metal preferably are about 10 micrometers to about 150 micrometers wide, preferably from about 40 micrometers to about 80 micrometers wide and are preferably parallel to and suitably spaced, suitably about 25 micrometers to about 100 micrometers, preferably from about 40 micrometers to about 80 micrometers from the grooves 126 in the semiconductor layer and are spaced apart from second grooves 126 by inactive portions 130 of semiconductor material.

As described above, the ablation of the semiconductor material formerly in third grooves 128 produces particulates, for example, particulate silicon from the ablation of amorphous silicon, which structurally weaken and burst through the portions of metal film 136 overlying the ablated semiconductor material to form gaps 129 that separate film 136 into a plurality of back electrodes 122. Gaps 129 preferably are substantially continuous as viewed along a line orthogonal to the plane of FIG. 2(f). The laser parameters required to produce continuous gaps 129 in metal film 136 will, of course, depend on a number of factors, such as the thickness and material of the metal film, the characteristic wavelength of the laser selected, the power density of the laser, the pulse repetition rate and pulse duration of the laser, and the scribing feed rate. After the removal of the back contact, particularly after using the laser method, the photovoltaic cell is preferably cleaned, preferably using an ultrasonic bath. The cleaning process removes dust particles and melted materials along the edges of the scribe patterns thereby reducing shunting. Following the laser scribing to form the photovoltaic modules of this invention, it is preferable to anneal the module. Annealing the module improves performance of the module, for example, by decreasing shunting loss. For example, the scribed module can be annealed in air at a temperature of 150 to about 175° C. for 0.5 to about 1.0 hour.

As mentioned above, the laser scribing method of this invention can be used to form scribes during the manufacture of a thin film photovoltaic module such as a CdS/CdTe module. Methods for manufacturing CdS/CdTe photovoltaic devices are disclosed in the references set forth hereinabove. In a preferred method, the manufacture of a CdS/CdTe module starts by deposition a layer of CdS on a substrate containing a CTO layer. Next, a layer of CdTe is deposited. Laser scribes through the CTO, CdS and CdTe layers. These scribes are spaced from each other and are preferably parallel to each other. The resulting scribes are filled with a photoresist and the photoresist is cured. A layer of carbon is applied and second laser scribes through the carbon, CdS and CdTe are added parallel to and spaced from the scribes through the CTO, CdS and CdTe layers. A metal back contact layer is applied and third laser scribes preferably parallel to and spaced from the second scribes are made through the metal, carbon, CdTe and CdS layers but not the CTO layer. One or more of the above-described laser scribes for making a CdS/CdTe module can be made using the method of this invention.

In the method of this invention, a linear laser beam shape can be used to form the desired scribes, as described hereinabove, in the various layers of a thin film photovoltaic device. Commercially available cylindrical optics or lenses can be used to focus the laser beam in to a linear beam shape. The cylindrical optics can be part of the focusing unit, such as the dynamic focusing unit, or can be a separate unit suitably located prior to the dynamic focusing unit. By linear beam we mean that the laser beam falling on the substrate surface is in the form of a band having length and width. The length can for example be about 0.01 mm to about 1 meter, more preferably about 10 cm to about 1 meter, and a width, for example, of about 5 microns to about 500 microns, more preferably about 20 microns to about 100 microns. Such a beam can be used to form a desired scribe having the length and width of the beam in a single pulse. Eximer lasers, such as the eximer lasers mentioned above, and preferably a KrF eximer laser operating at 248 nm, are preferred, because they typically have a very high peak power, a short wavelength, a high pulse energy and a short pulse duration, are preferred when a linear beam shape is desired. Using a linear shape is advantageous because it can speed up the scribing if the long direction of the beam is same as scribing direction. Also, using a linear beam shape the scribe width can be narrowed so that in the finished module more photovoltaically active surface is available for generating electrical energy.

In the method of this invention, the width of the scribe is preferably about the width of the laser beam used to form the scribe. However, the scribe width can be greater if more than one scan is used to make the scribe. In the method of this invention, the average power of the beam focused on and scanned over the substrate to make the scribes in the various layers is suitably about 20 to about 1000 W for scribing the front contact or CTO layers and suitably about 10 to about 20 W for scribing the semiconductor and metal back contact layers. However, it is to be understood that the power of the laser necessary to complete the desired scribes will be a function of such factors as the scribing rate, the laser selected, the size of the laser spot focused on the layer on substrate plate, and the material being scribed.

The high repetition rates for the lasers used in the method of this invention can be obtained by combining laser beams from two or more laser devices, for example, laser cavities. For example, two laser devices, preferably the laser cavities, can be controlled by the same controller where the laser Q-switches for each laser are adjusted so the laser radiation emanating from each laser device are shifted one pulse apart. The repetition rate of the laser beam resulting from such a combination of two laser devices would be twice the repetition rate of each laser, that is, the pulse of a first laser beam comes between the pulses of the second laser beam. In this manner, for example, two laser devices, each operating individually at 100 KHz, can be used to form a laser beam having a repetition rate of 200 KHz. More than two lasers devices can be combined in this manner to achieve even higher repetition rates such as 300 KHz or more, or 400 KHz or more, or 500 KHz or more. In this manner, two laser devices, such as laser cavities, each operating at, for example, 100 KHz and at wavelengths of 1064 nm, can be combined in the manner described above to form a single beam as described above operating at 200 KHz. Such a combined beam can also be passed through a device to increase the frequency of the beam, such as a frequency doubling crystal, to produce a laser beam having a wavelength of 532 nm and a repetition rate of 200 KHz.

Figure 7:
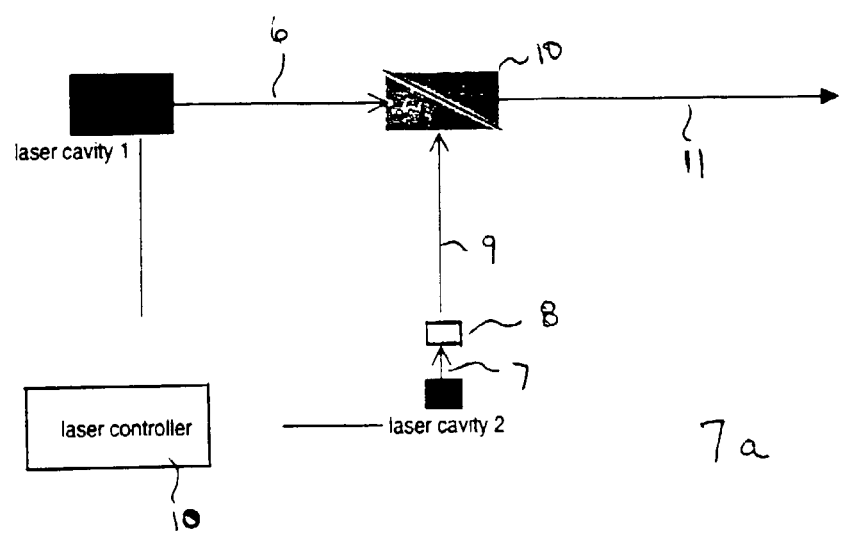
FIGS. 7(a) and 7(b) are schematics of two arrangements for producing a high repetition rate laser beam.
Figure 7:
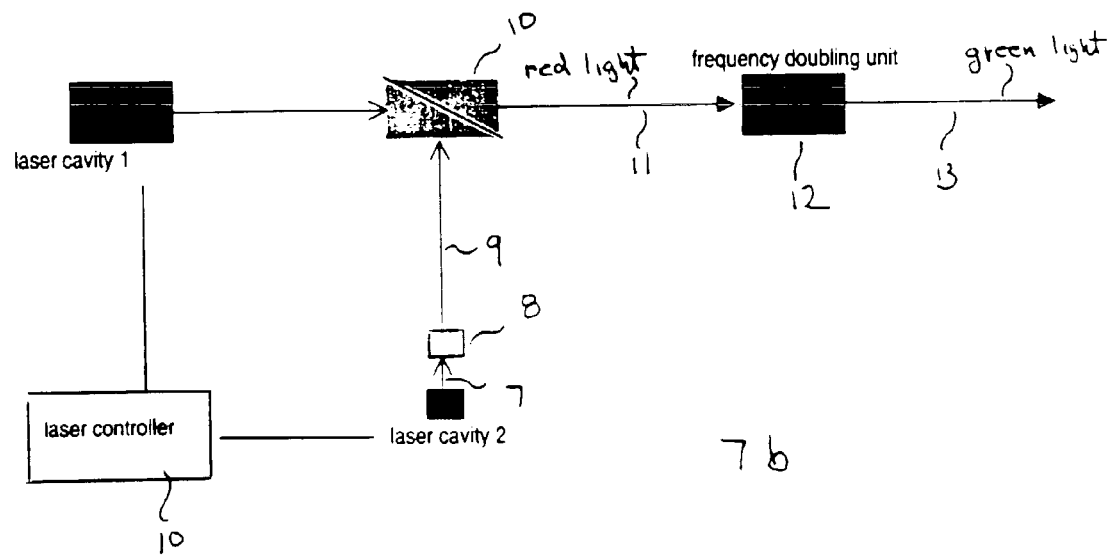

FIG. 7 shows in schematic form two arrangements to produce a high repetition rate laser beam. In FIG. 7a, laser controller 10 controls laser cavity 1 and laser cavity 2 so that the pulses from each laser are one pulse apart. This is typically accomplished by controlling the laser Q-switches in the laser cavities. Laser beam 6 from laser cavity 1 enters laser beam separator/combiner 10. Laser beam 7 from laser cavity 2 enters waveplate 8. Laser beam 9 exits waveplate 8 and enters laser beam separator/combiner 10. Combined laser beam 11 exits laser beam separator/combiner 10 having twice the repetition rate of the laser beams 6 and 9. The waveplate 8 can be used to impart unequal phase shifts to orthogonally polarized field components of the laser beam 7 causing the conversion of one polarization state to another. The laser beam separator/combiner can transmit one polarization state and reflects the other. FIG. 7b is the same as FIG. 7, with the same components numbered in the same manner, except that FIG. 7b also has a frequency doubling unit, for example a frequency doubling crystal, 12 to double the frequency of laser beam 11 to form frequency doubled laser beam 12.

Figure 4:
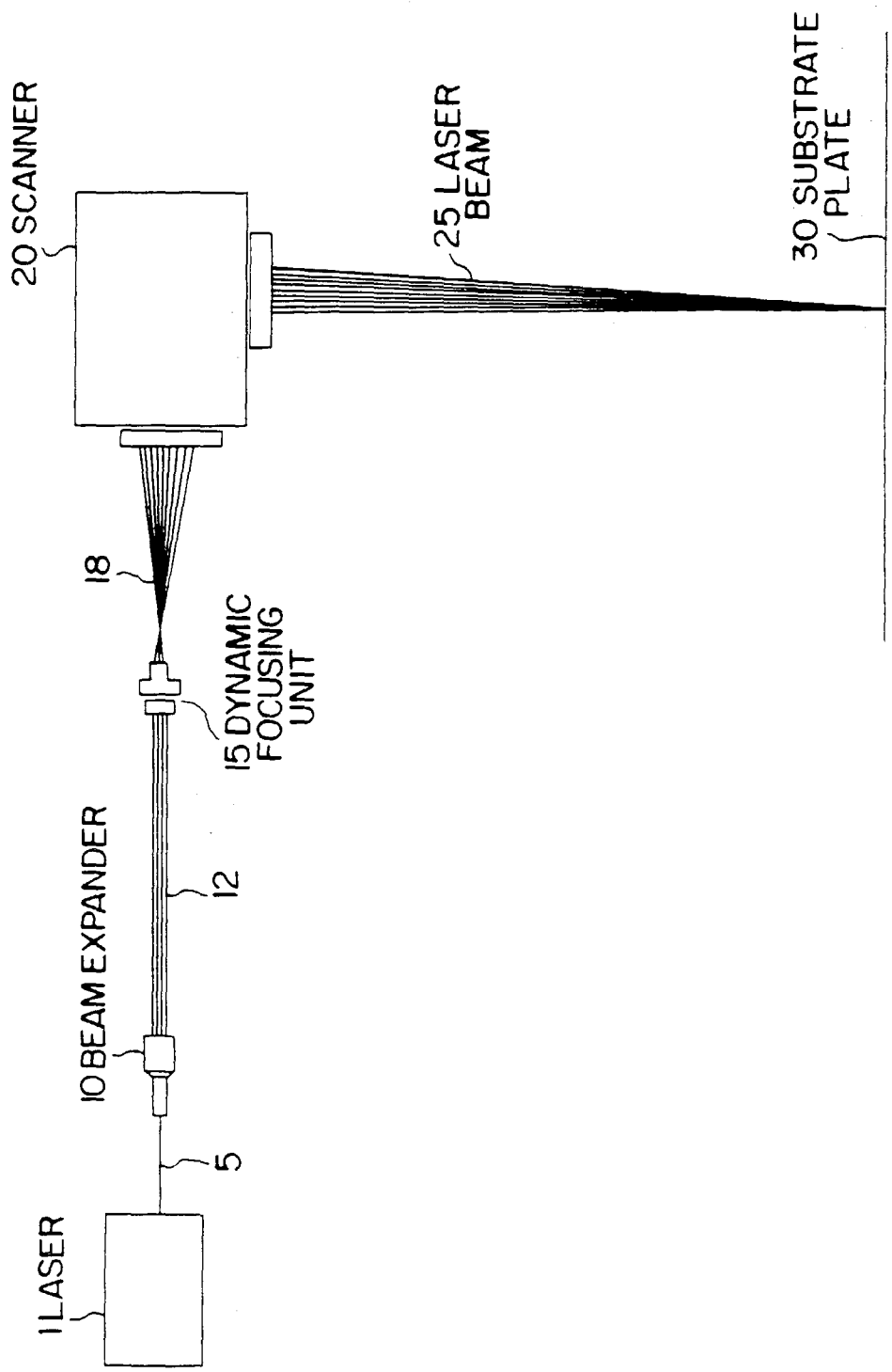
FIG. 4 is a schematic diagram of a laser scanning apparatus useful in the method of this invention.

A suitable apparatus for scanning the laser beam across the photovoltaic module to form the grooves in the front contact, semiconductor layer or layers and in the back contact is shown in FIG. 4. In FIG. 4, laser 1, for example, an eximer laser, such as an ArF (193 nm), KrF (248 nm), XeCl (308 nm), XeF (351 nm), or a solid state laser, for example, an Nd:YAG, Nd:YLF, or Nd:YVO$_4$ laser, produces laser beam 5 having the desired wavelength and beam shape.

Laser beam 5 enters beam expander 10 to produce expanded laser beam 12. Suitable beam expanders are available from, for example, CVI, Special Optics, OptoSigma, Coherent, and other sources. Beam expander lowers laser beam divergence and generally improves beam quality. Expanded beam 12 enters dynamic focusing unit 15.

For very large substrates, for example, substrates having an area of more than about 10 or more than about 15 square feet, the distance between the working surface of the substrate and the laser focusing optics varies as a function of laser beam location on the plate. Dynamic focusing optics or other means for focusing are used to focus the laser beam on the substrate plate during scanning irrespective of the location of the beam on the substrate. A suitable dynamic focusing unit can be obtained from, for example, Scanlab or General Scanning. Using the dynamic focusing unit, the laser beam is focused at the work surface. When the beam is not focused, the energy density is smaller. When the beam is focused into a suitably sized spot, the energy density exceeds ablation threshold of the material to be removed so that the laser scribing can be carried out efficiently. Focused beam 18 exits dynamic focusing unit 15 and enters scanner unit 20. In scanner unit 20 the laser beam is directed to the photovoltaic substrate 30 in the desired pattern to produce scribes in the front contact, the semiconductor layers and in the back metal contact as described hereinabove. The scanner suitably utilizes X-Y coordinate scanning mirrors controlled by galvanometers. The galvanometers are preferably connected electrically to a scanner controller, which is preferably a computer board, which controls the X-Y mirrors and the dynamic focusing unit. The scanner control directs the X and Y mirrors and reflects the beam onto the substrate 30 in the desired pattern. Thus, substrate 30 can remain motionless while laser beam 25 exiting the scanner scans rapidly over the surface of the substrate forming the desired scribes or grooves. A galvanometer scanner with two mirrors (X and Y) in an orthogonal configuration is a simple, fast and economical apparatus that can be used to perform the laser scribing in accordance with the method of this invention. Laser scanners, which can be used in the method of this invention, are available from several companies such as General Scanning and Scanlab. Preferably, in the apparatus for carrying out the method of this invention, the laser, dynamic focusing unit and the X-Y scanner are controlled by a common computer which determines when to switch the laser on (a gate control) and where to direct the beam to at a desired focusing condition. A computer such as a commercially available, standard Pentium-type PC computer made by, for example, Hewlett Packard, or equivalent computer, using Microsoft Visual Basic or equivalent control software, is a suitable system for performing the computer controlled operations in accordance with the method of this invention.

As discussed in detail above, the front contact or the transparent conductive oxide (TCO) layer is preferably scribed first. The scribes are preferably parallel to each other. Photovoltaically active layers such as the amorphous silicon layers are applied to the substrate after the front contact layer. As described above, another set of laser scribes are made preferably parallel to and next to the scribes in the front contact layer. Since the scribes preferably do not cross each other, the second set of scribes is preferably referenced to the scribes in the front contact layer. Several methods can be used in the method of this invention to detect the set of scribes in the front contact layer to set the location and position of the scribes in the photovoltaically active layers (the interconnect scribes) as well as the third set of scribes in the back or rear contact layer. In one method, the scanner is used to scan a low power laser beam, for example a beam produced by lowering the laser diode current. Preferably, the lower power beam also has a very high repetition rate. Low power and high repetition rate are used to reduce laser peak power to minimize and preferably preclude any damage which might otherwise be caused by the scanning laser as it scans the surface of the module. Preferably, the power of the laser is no more than about 10 mW preferably about 1 to about 10 mW. Preferably, the repetition rate is at least about 100 kHz, preferably about 100 to about 1000 kHz. When the low power laser beam passes a scribe in the front contact as it scans the surface of the module, more laser power will pass through the scribe compared to a location on the module without such scribe. The scribe in the front contact reflects and scatters the low power laser beam differently compared to the regions on the module without the scribe. At the edges of the scribes, reflection and scattering of the laser beam are distinctly different from that at other areas. Scribe positions are located by detecting either transmission differences, reflection or scattering of the low power laser beam. Preferably, a camera, such as a CCD (charge coupled device) camera is used to monitor the general area and identify locations where transmission of the low power laser beam is greater or where the laser beam light is scattered or reflected. A telescope may be coupled to the camera so that the process can be monitored at a distance. A fiber optic based camera can be used for flexible handling. Data from the camera is sent to the control computer or other scanner control means and is used to direct the scanner to form the desired scribes. This method of locating the scribes in the front contact is particularly useful for amorphous-silicon based photovoltaic devices when an infrared (IR) laser beam, for example a beam from the fundamental wavelength of a Nd:YAG or other solid state laser as mentioned hereinabove, is used as the low power beam to scan the scribes in the front contact layer because the IR laser beam passes through the amorphous silicon layers and reflects at the front contact layer. When the scanned beam encounters a scribe in the front contact layer most of the beam power is transmitted through the layer and when the beam is on a portion of the front contact layer that is not scribed, most of the beam power is reflected. This difference in the transmitted compared to the reflected beam is used to locate the scribes in the front contact layer and is used as an index to direct the scanner for locating the position of and thereafter forming the scribes in the semiconductor layer and in the back contact layer as described hereinabove. The same laser operating at different power levels and the same scanner can be use to scan for locating the scribe in the front contact layer and for forming the scribes in the amorphous silicon photovoltaically active layers and the back contact layer. In another method, a second, separate scanner and, optionally, a second, separate laser can be used for locating or referencing the scribes in the front contact layer.

Figure 5:
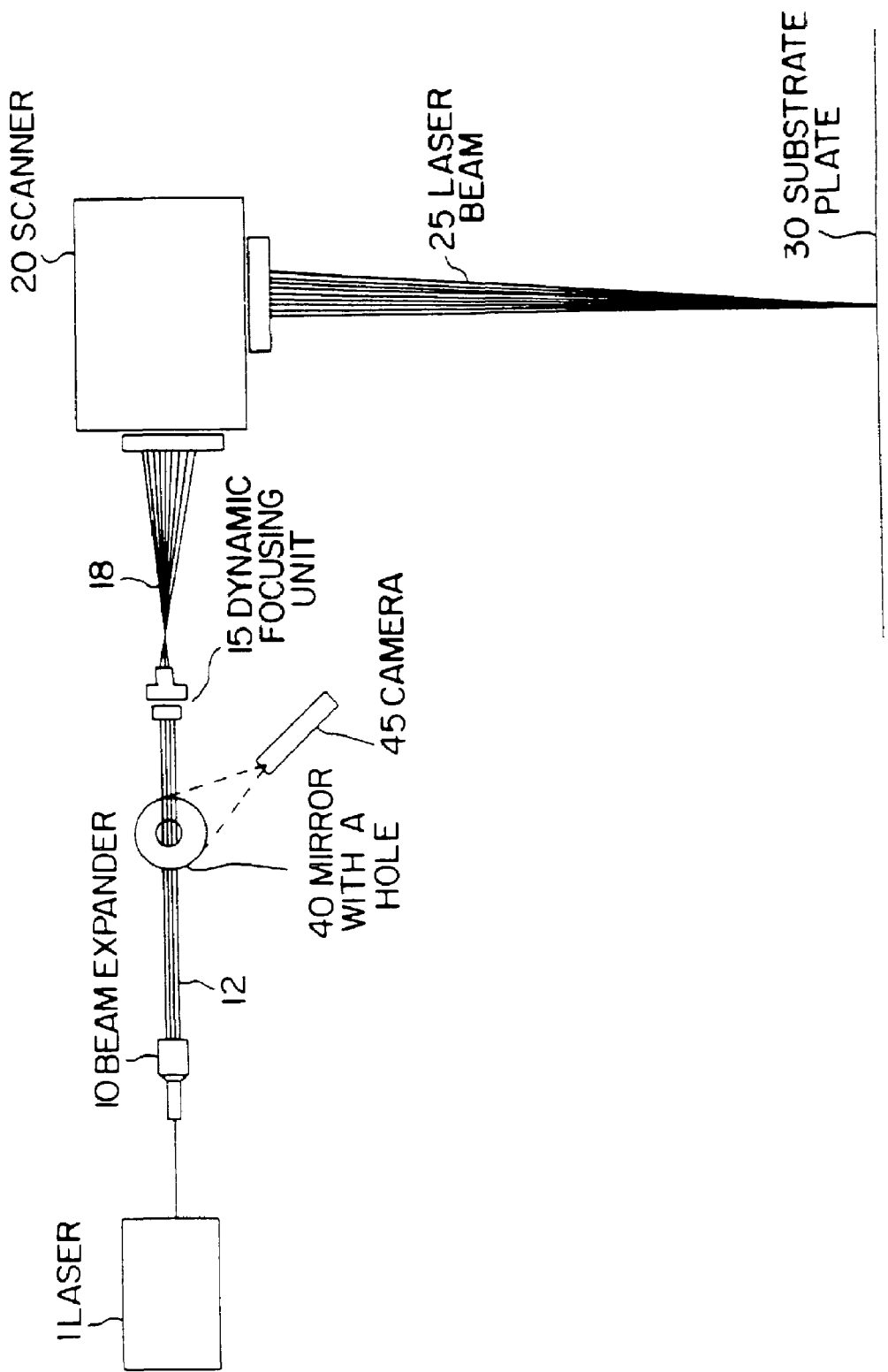
FIG. 5 is a schematic diagram of a laser scribing apparatus useful in the method of this invention.

In yet another method, a camera system, such as a CCD camera, can be used to detect the scribe positions in the front contact layer. In one embodiment of this method, a mirror with a hole in its center can be positioned just before where the laser beam enters the dynamic focusing unit. The mirror allows the laser beam to pass through the hole and reflects the image of the substrate containing the scribes in the front contact layer to the camera. The image of the substrate being scanned is sent from the camera to the control computer. Since the scanning system with the dynamic focusing unit functions like a telescope, the image of the scribes in the front contact layer is apparent when viewed through the dynamic focusing optics. This image and the data derived therefrom are used to position the scribes in the semiconductor layer and in the back contact. FIG. 5 shows the apparatus of FIG. 4 except that FIG. 5 also includes a mirror 40 with having a whole in it so that laser beam 12 can pass through the hole. Camera 45 as shown in FIG. 5 detects the image of the plate 30 and sends the data to a control computer that controls the operation of the laser and scanners so the desired scribes in the layers on substrate plate 30 can be made at precise locations. Components numbered the same in FIGS. 4 and 5 represent the same components.

Figure 6:
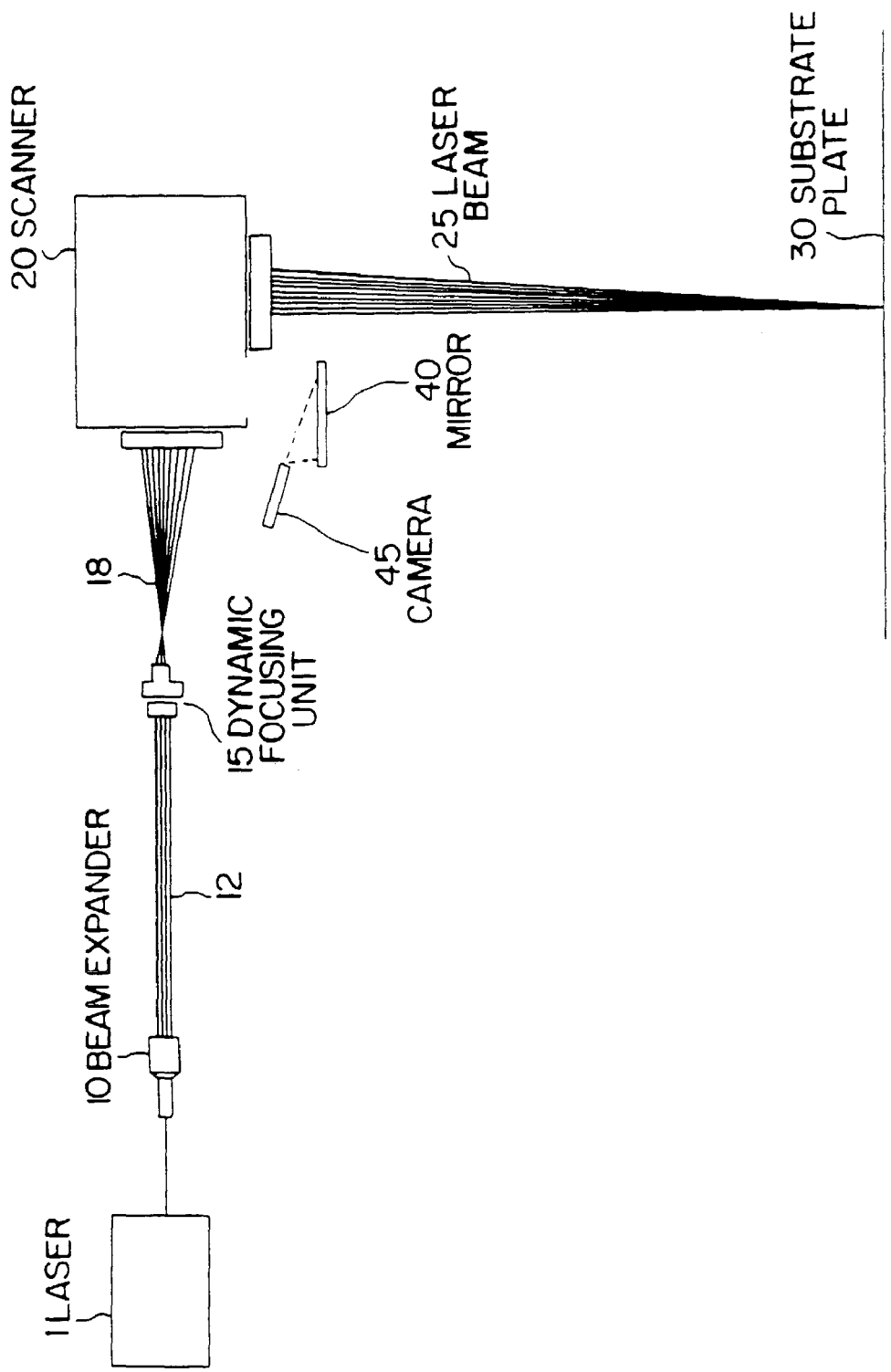
FIG. 6 is a schematic diagram of a laser scribing apparatus useful in the method of this invention.

In still another method, the camera, such as a CCD camera, is located after the dynamic focusing unit and positioned to view the X-Y mirror images directly to "see" the scribes in the front contact layer on the substrate. FIG. 6 shows the apparatus of FIG. 4 except that FIG. 6 also includes a mirror 40 and a camera 45 with the camera and mirror positioned to view the X-Y mirrors (not shown) within the scanner. With this apparatus camera 45 detects the image of the plate 30 and sends the data to a control computer that controls the operation of the laser and scanners so the desired scribes in the layers on substrate plate 30 can be made at precise locations. Components numbered the same in FIGS. 4 and 6 represent the same components. In an alternate embodiment, the mirror 40 is not used and camera 45 views the X-Y mirrors in the scanner directly. If linear beams are desired for scribing, linear beam optics can be included in the dynamic focusing unit 15 in FIGS. 4-6 or such optics can be separate and suitably located between beam expander 10 and focusing unit 15 in FIGS. 4-6.

In the method of this invention, a single laser and single scanner can be used to form one or more of the different types of scribes described herein. However, the invention is not so limited. Two or more lasers can be used and two or more scanners can be used to form the desired scribes.

In another embodiment of this invention, the interconnect scribe and interconnect through the semiconductor layer can be made in a single step rather then first forming the scribe through the semiconductor layers followed by filling such scribe with the metal of the back contact. In this single step method, the back contact layer is added over the semiconductor layer without scribing the semiconductor layer to form the scribe for the interconnect. The metal layer is subsequently scribed using, for example, a long wavelength laser, such as a solid state laser as described hereinabove, preferably producing laser light having a wavelength of about 1064 nm, and melting the metal layer in the desired locations on the substrate so that the molten metal diffuses through the semiconductor layer to make contact with the front contact located below the semiconductor layer. The scribe rates, scribe widths, pulse rates, repetition rate are as set forth hereinabove for forming the interconnect scribes and the scribes in the back contact layers.

In another embodiment of the present invention, scribes in the semiconductor layers (the interconnect scribes) and in the back contact are accomplished simultaneously. A method for such simultaneous scribing of the interconnect scribes and the scribes in the back contact comprises using two laser beams, preferably of different wavelength light, and separated by a fixed distance corresponding to the distance between the two desired scribes as described hereinabove. The double beam is focused and then directed by the scanning unit to form the scribe in the semiconductor layer or layers and the back contact layer at the same time. In another embodiment for simultaneously forming the scribes in the semiconductor layers and the scribes in the back contact, a laser is used that produces two beams, each of different wavelengths. For example, a Nd:YVO$_4$ laser producing laser light beams at both 1064 nm (infrared light) and 532 nm (green light). Such a laser is available from, for example, Photonics Industries. A beam displacement optics unit is used to separate the beams into two distinct beams separated by the desired distance determined by a distance desired between the scribes in the semiconductor layers and the scribes in the metal contact layer on the photovoltaic module. Beam displacement optics can be located prior to, after, or as part of the dynamic focusing unit shown in FIGS. 4-6. The appropriately displaced beams of different wavelengths are scanned over the surface of the module using a scanner, as described above. Such a method precludes the scribes from crossing each other because the beams are always side-by-side. Preferably, since the beams are of different wavelengths, broadband optics are used to direct the beams through a single dynamic focusing unit before the beams enter the scanner. In the method of this invention for simultaneously forming interconnects and the scribe in the back contact, the interconnect is made by melting the metal layer through the semiconductor layer as described above. The apparatus shown in FIGS. 4-6 can be used to make the interconnect and interconnect scribe at the same time and can also be used to perform the simultaneous scribing of the interconnect and the scribe in the back contact layer.

The substrate used in the method of this invention to make the photovoltaic modules can be any size and shape. However, the method of this invention is particularly desirable for producing larger sized photovoltaic modules, particularly those used in architectural applications. In such applications the substrate and resulting photovoltaic module will preferably be made of glass and will range in size of about 10 to about 15 square feet to about 200 square feet and will preferably be either rectangular or square in shape, although the exact shape is not limited. One of the features of the process of this invention is the ability to have a range or variety of substrate shapes and sizes without changing the processing apparatus. Thus, the process of this invention can be used to manufacture photovoltaic devices suitable, for example, for specific architectural applications. The thickness of the substrate is also variable and will, in general, be selected in view of the application of the photovoltaic device. If, for example, the photovoltaic device uses glass as the substrate, the thickness of the glass can range in thickness from 0.088 inches to about 0.500 inches, more preferably from about 0.125 inches to about 0.250 inches. If the glass will be used in large dimensions, such as for example, at least about 60, or at least about 200 square feet, the glass will preferably have a thickness of at least about 0.125 inches, more preferably of at least about 0.187 inches. When the glass substrate has a thickness of at least about 0.187 inches or at least about 0.250 inches, it will preferably be a low iron glass. By low iron we mean, preferably, that the glass has no more than about 0.1 wt % iron, more preferably less than about 0.1 wt % iron. Preferably, the substrate used in the method of this invention is monolithic, i.e., one single piece of substrate, thus forming monolithic modules.

Upon completion of the deposition of the various layers and the scribing of the layers as set forth herein, the photovoltaic device formed is generally sealed to another substrate plate to form a sealed module. The sealing protects the photovoltaic elements from exposure to moisture and other elements of the environment that can cause deterioration in the performance of the module. Methods for sealing the module are known to those of skill of the art. One method, however, comprises placing a sheet of polymeric encapsulant material such as polyethylene vinyl acetate (EVA) between the substrate containing the thin film photovoltaic device and a second substrate, such as a second glass sheet and then heating and pressing the substrate and the second glass sheet together sealing the photovoltaic device between the substrate and the second glass sheet. Other encapsulants besides EVA can be used with or in place of the EVA, such as: Tedlar type plastic, Nuvasil type plastic, Tefzel type plastic, ultraviolet (UV) curable coatings, etc. and combinations thereof.

As described hereinabove, the method of his invention does not require the movement of the substrate plates under the laser beam to form the desired scribes. Rather, it is the laser beam that is rapidly scanned over the substrate plate. However, the substrate can be in motion in accordance with the method of this invention as, for example, in an assembly line where the substrate is moving along in a series of process steps to manufacture the module.

The modules of this invention can also be semitransparent or partially transparent thin film modules, for example, thin film modules where portions of the metal contact has been removed in order to permit light to pass through and images to be seen through the modules. Such modules are disclosed in U.S. patent application Ser. No. 09/891,752, filed on Jun. 26, 2001, and titled "Partially Transparent Photovoltaic Modules", and which is incorporated herein by reference.

Only certain embodiments of the invention have been set forth above. Alternative embodiments and various modifications will be apparent from the above description to those of skill in the art. These and other alternatives are considered equivalents and within the spirit and scope of the present invention.

EXAMPLE

Using the apparatus as shown in FIG. 5, a 48 inch long by 26 inch wide glass plate ⅛ inch in thickness having a 0.6-0.8 micrometer layer of tin oxide doped with fluorine is scribed to remove the tin oxide using a $Nd:YVO_4$ laser operating at 32 nm at 30 kHz reprate delivering an average laser power of about 5 W by scanning the laser over the tin oxide laser at a rate of about 1 meter per second. The scribes are set parallel to the length of the glass plate and are spaced from each other about 9 mm and are about 50 micrometers in width. Such scanning results in a series of strips of tin oxide layer approximately 9 mm wide separated by 50 micrometer wide scribes across the entire surface of the glass substrate. Bus bars are added by placing a bead of silver-containing frit paste along the length of the outside edges of the first an last strip of conductive oxide. The beads are extended to a point near the center of one end of the substrate to function as positive and negative terminal points for making electrical connection to the module. The frit is cured by heating the module at about 550° C. for about five minutes. (Bus bars are added prior to scribing of the tin oxide layer.) A photovoltaically active p-i-n junction made of amorphous silicon is deposited on the tin oxide layer using chemical vapor deposition techniques followed by a layer of zinc oxide. The amorphous layer is about 2000 Å thick. The amorphous layers fill the scribes made in the conductive tin oxide. A second set of scribes are made in the amorphous silicon and zinc oxide layers by scanning a laser beam from a $Nd:YVO_4$ laser operating at 532 nm, 50 kHz (kilo Hertz) reprate and about 4 W average power. The scribing rate is approximately 5 meters/sec and the scribe width about 100 micrometers. The scribes in the amorphous silicon and zinc oxide layers are parallel to and spaced from the scribes in the tin oxide layer by about 150 micrometers. A layer of aluminum about 4000 Å is deposited by magnetron sputtering over the zinc oxide layer and filling the scribes in the amorphous silicon layer with aluminum. A third set of scribes are made in the aluminum layer by scanning a laser beam from a $Nd:YVO_4$ laser operating at 532 nm, at 50 kHz reprate and about 5 W average power at the amorphous silicon layer under the aluminum layer where the scribes in the aluminum layer are to be formed. The scribing rate is about 4 meters/second and the scribe width is about 150 micrometers. The third scribes are parallel to the second scribes and spaced from the second scribes by about 150 micrometers. The location of the second and third scribes relative to the first scribes through the tin oxide layer is determined by scanning the substrate with the Nd:YVO$_4$ laser operating at low power (about 5 mW) and using the camera to record the placement of the first scribe by detecting the difference in the reflectance, scattering or transmission of the low power laser beam as it crosses a scribe in the tin oxide layer. The computer automatically offsets the beam for the second and third scribes by the distance of 150 micrometers once the location of the first scribe is determined by the camera.

U.S. Provisional Patent Application Ser. No. 60/375,947 filed Apr. 26, 2002 and U.S. Provisional Patent Application Ser. No. 60/346,327 filed Jan. 7, 2002 are incorporated by reference herein in their entirety.

Having described the invention, that which is claimed is:

1. A method for manufacturing a thin film photovoltaic module comprising series connected cells, the cells comprising a front contact, a back contact and a photovoltaically active region positioned between the front and back contacts, the series connected cells being formed by scribing a front contact layer, a photovoltaically active layer and a back contact layer on a substrate, the method comprising laser scribing at least one of the front contact layer, the photovoltaically active layer or the back contact layer to form laser scribes using a laser beam scanned over the layer wherein the front contact layer is scanned with a low-power laser beam to locate the position of the scribes in the front contact layer by measuring the difference in one or more of the transmission, reflection or scattering of the low-power laser beam caused by the scribes in the front contact layer and using the differences measured to position the scribes in one or both of the photovoltaically active and back contact layers.

2. The method of claim 1 wherein the front contact layer, the photovoltaically active layer and the back contact layer are scribed using a laser beam scanned over the layer.

3. The method of claim 1 wherein the photovoltaically active layer and the photovoltaically active region comprises amorphous silicon.

4. The method of claim 1 wherein the photovoltaically active layer and photovoltaically active region comprises CdS/CdTe.

5. The method of claim 1 wherein the laser beam is scanned at a rate of about 1.0 to about 50 meters/second to form the scribes.

6. The method of claim 1 wherein the apparatus used to perform the laser scribing comprises a laser, a beam expander, a dynamic focusing unit and a scanner.

7. The method of claim 6 wherein the scanner comprises X-Y mirrors operated by a galvanometer.

8. The method of claim 6 further comprising optics for forming a linear laser beam shape.

9. The method of claim 8 wherein the laser used to form the laser scribes is an Eximer laser.

10. The method of claim 1 wherein the shape of the laser beam scanned rapidly over the layer to form the laser scribes is linear.

11. The method of claim 1 wherein the laser beam used to form the scribes is the second harmonic of a solid state laser.

12. The method of claim 1 wherein the laser beam to form the scribes is a high reprate laser beam obtained by combining two or more laser beams of a lower reprate to form the high reprate laser beam.

13. The method of claim 1 wherein power of the low-power laser is about 1 to about 10 mW.

14. The method of claim 1 wherein the repetition rate of the low-power laser is about 100 to about 1000 kHz.

15. The method of claim 1 wherein photovoltaically active layer comprises amorphous silicon and the low power laser beam in an infrared laser beam.

16. The method of claim 15 wherein a difference in the transmitted compared to a reflected laser beam is used to locate the scribes in the front contact layer.

17. A method of manufacturing a photovoltaic device on a substrate comprising the steps of:
(a) depositing a transparent and electrically conductive film on a substrate to form a front contact layer;
(b) laser scribing first grooves in the front contact layer with a rapidly scanning laser beam to form front contact segments on the substrate;
(c) depositing and forming a layer or layers of a semiconductor material on said front electrode segments, and filling the first grooves with the semiconductor material;
(d) laser scribing second grooves in the layer or layers of semiconductor material with a rapidly scanning laser beam at positions adjacent to the first grooves;
(e) depositing and forming a back contact layer comprising a metal on the layer or layers of semiconductor material, and filling the second grooves with the metal to form a series connection to connect the front electrode segments and the back contact layer; and
(f) laser scribing third grooves in the back contact layer with a rapidly scanning laser beam at positions adjacent to said second grooves wherein the front contact layer is scanned with a low-power laser to locate the position of the first grooves in the front contact layer by measuring the difference in one or more of the transmission, reflection or scattering of the low-power laser beam caused by the first scribes in the front contact layer and using the differences measured to position grooves in the semiconductor material layer or layers, the back contact layer, or the semiconductor material layer or layers and the back contact layer.

18. The method of claim 17 wherein the semiconductor material comprises amorphous silicon.

19. The method of claim 17 wherein the scribing of the grooves is performed at about 1.0 to about 50 meters/second.

20. The method of claim 17 wherein the shape of the laser beam used to form the scribes is linear.

* * * * *